(12) United States Patent
Pratt et al.

(10) Patent No.: US 7,991,367 B2
(45) Date of Patent: Aug. 2, 2011

(54) WIRELESS COMMUNICATION UNIT AND POWER CONTROL SYSTEM THEREOF

(75) Inventors: Patrick J. Pratt, Mallow (IE); Michael A. Milyard, Chandler, AZ (US); Daniel B. Schwartz, Scottsdale, AZ (US); Philip C. Warder, Planton, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 998 days.

(21) Appl. No.: 11/722,293

(22) PCT Filed: Dec. 23, 2004

(86) PCT No.: PCT/EP2004/053690
§ 371 (c)(1),
(2), (4) Date: Jun. 20, 2007

(87) PCT Pub. No.: WO2006/066627
PCT Pub. Date: Jun. 29, 2006

(65) Prior Publication Data
US 2009/0280758 A1 Nov. 12, 2009

(51) Int. Cl.
*H04B 1/04* (2006.01)
(52) U.S. Cl. ............... 455/114.3; 455/115.1; 455/126; 455/127.1
(58) Field of Classification Search .......... 455/114.3, 455/115.1, 126, 127.1, 127.2, 522
See application file for complete search history.

(56) References Cited

U.S. PATENT DOCUMENTS

| | | | |
|---|---|---|---|
| 3,900,823 A | 8/1975 | Sokal et al. | |
| 5,150,075 A | 9/1992 | Hietala et al. | |
| 5,296,821 A | 3/1994 | Petersen et al. | |
| 5,334,979 A | 8/1994 | Hatakeyama | |
| 5,548,616 A | 8/1996 | Mucke et al. | |
| 5,675,287 A | 10/1997 | Baker et al. | |
| 5,699,383 A * | 12/1997 | Ichiyoshi | 375/297 |
| 6,043,707 A * | 3/2000 | Budnik | 330/10 |
| 6,133,789 A * | 10/2000 | Braithwaite | 330/149 |
| 6,169,886 B1 | 1/2001 | Black et al. | |
| 6,236,267 B1 * | 5/2001 | Anzil | 330/149 |
| 6,272,336 B1 | 8/2001 | Appel et al. | |
| 6,466,772 B1 | 10/2002 | Rozenblit et al. | |
| 6,657,493 B2 * | 12/2003 | Ode et al. | 330/149 |
| 6,687,511 B2 * | 2/2004 | McGowan et al. | 455/522 |
| 6,792,282 B1 | 9/2004 | Domino et al. | |
| 6,836,517 B2 * | 12/2004 | Nagatani et al. | 375/296 |
| 6,904,268 B2 * | 6/2005 | Leizerovich | 455/126 |

(Continued)

FOREIGN PATENT DOCUMENTS

EP 0261967 B1 3/1988

(Continued)

OTHER PUBLICATIONS

Smith, O.J.M., "A Controller to Overcome Dead Time," ISA Journal, vol. 6, No. 2, Feb. 1959, pp. 28-33.

(Continued)

*Primary Examiner* — Duc M Nguyen (57) ABSTRACT

A wireless communication unit comprises a transmitter having an analogue feedback power control loop having a power control function arranged to set an output power level of the transmitter. The power control function comprises a predictor sub-system arranged to reduce sensitivity to loop latency of the analogue feedback power control loop. The use of a predictor sub-system provides reduced sensitivity to loop latency, gain variations and delay.

24 Claims, 6 Drawing Sheets

U.S. PATENT DOCUMENTS

| | | | |
|---|---|---|---|
| 7,149,482 B2 * | 12/2006 | Kenington | 455/91 |
| 7,383,028 B2 * | 6/2008 | Suzuki et al. | 455/126 |
| 7,409,004 B2 * | 8/2008 | Booth et al. | 375/295 |
| 7,551,905 B2 * | 6/2009 | Kubo et al. | 455/126 |
| 2003/0139153 A1 | 7/2003 | McMorrow et al. | |
| 2003/0160656 A1 | 8/2003 | Pratt et al. | |
| 2004/0196922 A1 | 10/2004 | Leffel | |
| 2004/0219891 A1 | 11/2004 | Hadjichristos | |
| 2010/0009642 A1 | 1/2010 | Pratt et al. | |

FOREIGN PATENT DOCUMENTS

| | | | |
|---|---|---|---|
| EP | 0524008 A | 1/1993 | |
| WO | 9707441 A1 | 2/1997 | |
| WO | 2006066627 A1 | 6/2006 | |

OTHER PUBLICATIONS

Zhang, Shuyun, Madic, Jelena, Bretchko, Pavel, Mokoro, Julius, Shumovich, Raymond, and McMorrow, Rob, "A Novel Power-Amplifier Module for Quad-Band Wireless Handset Applications," 2003 IEEE vol. 51, No. 11, Nov. 2003, pp. 2203-2210.

Office Action mailed Jun. 25, 2010 for U.S. Appl. No. 11/772,296, 14 pages.

Notice of Allowance mailed Dec. 21, 2010 for U.S. Appl. No. 11/772,296, 15 pages.

PCT International Search Report mailed Sep. 1, 2005 for PCT/US2004/053691, 5 pages.

* cited by examiner

WIRELESS COMMUNICATION UNIT AND POWER CONTROL SYSTEM THEREOF

FIELD OF THE INVENTION

This invention relates to power control in a wireless communication unit. The invention is applicable to, but not limited to, improving the performance of wireless Power Amplifier control loops that contain appreciable latency and/or lag, coupled with substantial control parameter variation.

BACKGROUND OF THE INVENTION

Wireless communication systems, for example cellular telephony or private mobile radio communication systems, typically provide for radio telecommunication links to be arranged between a plurality of base transceiver stations (BTS) and a plurality of subscriber units. An established harmonised cellular radio communication system, providing predominantly speech and short-data communication, is the Global System for Mobile Communications (GSM). GSM is often referred to as $2^{nd}$ generation cellular technology.

An enhancement to this cellular technology, termed the General Packet Radio System (GPRS), has been developed. GPRS provides packet switched technology on GSM's switched-circuit cellular platform. A yet further enhancement to GSM that has been developed to improve system capacity can be found in the recently standardised Enhanced Data Rate for Global Evolution (EDGE) that encompasses Enhanced GPRS (EGPRS). A still yet further harmonised wireless communication system currently being defined is the universal mobile telecommunication system (UMTS). UMTS is intended to provide a harmonised standard under which cellular radio communication networks and systems will provide enhanced levels of interfacing and compatibility with many other types of communication systems and networks, including fixed communication systems such as the Internet. Due to this increased complexity, as well as the features and services that it supports, UMTS is often referred to as a third generation (3G) cellular communication technology. In UMTS subscriber units are often referred to as user equipment (UE).

Within GSM, two modes of operation (e.g. two modulation schemes) may be used, Gaussian Minimum Shift-keyed (GMSK) modulation and 8-phase shift keyed (8-PSK) modulation. GMSK is a constant amplitude phase modulation scheme whilst, for the second generation (2G) standard, 8-PSK incorporates both amplitude and phase modulation.

In such cellular wireless communication systems, each BTS has associated with it a particular geographical coverage area (or cell). The coverage area is defined by a particular range over which the BTS can maintain acceptable communications with subscriber units operating within its serving cell. Often these cells combine to produce an extensive coverage area.

Wireless communication systems are distinguished over fixed communication systems, such as the public switched telephone network (PSTN), principally in that mobile stations/subscriber equipment move between coverage areas served by different BTS (and/or different service providers). In doing so, the mobile stations/subscriber equipment encounter varying radio propagation environments. In particular, in a mobile communication context, a received signal level can vary rapidly due to multipath and fading effects.

One feature associated with most present day wireless communication systems allows the transceivers in either or both the base station and/or subscriber unit to adjust their transmission output power to take into account the geographical distance between them. The closer the subscriber unit is to the BTS's transceiver, the less power the subscriber unit and BTS's transceiver are required to transmit, for the transmitted signal to be adequately received and decoded by the other unit. Thus, the transmit power is typically controlled, i.e. set to a level that enables the received signal to be adequately decoded, yet reduced to minimize potential radio frequency (RF) interference. This 'power control' feature saves battery power in the subscriber unit. Initial power settings for the subscriber unit, along with other control information, are set by the information provided on a beacon (control) physical channel for a particular cell.

Furthermore, in a number of wireless communication systems, the effect of fast fading in the communication channel is a known and generally undesirable phenomenon caused by the signal arriving at a receiver via a number of different paths. Therefore, fast power control loops are often adopted to rapidly determine and optimize the respective transmit power level.

It is known that within the field of power control techniques that the power control loop gain and bandwidth of existing power control mechanisms are severely limited by the loop latency (also known as dead time or pure lag). As loop latency increases, the controller gain has to be reduced to maintain adequate stability margins. As a consequence the closed loop bandwidth will diminish with the system becoming progressively slower and more sensitive to variations in internal dynamics. As a result of these variations, critical standards' test specifications are failed, such as:

(i) Power versus time (PvT), or
(ii) Out-of-band spectral emission performance

Furthermore, any variation in the threshold or activity level is known to complicate the loop ramp-up sequencing.

The conventional solution to the above problems has been to perform extensive factory calibration or 'phasing' of the loop, where the controller settings are phased with target power and frequency. However, such a solution is not a viable option in the future due to the unacceptable overhead that such a factory-tuning exercise creates in the manufacture of a mass-produced product, such as a 3G cellular phone. Furthermore, this solution offers no robustness with regard to temperature and power supply variations that are inherent within an operational unit.

A need therefore exists, in general, for an improved power control arrangement and method of operation, wherein the abovementioned disadvantages may be alleviated.

STATEMENT OF INVENTION

In accordance with the present invention, there is provided a wireless communication unit comprising a power control system, as defined in the appended claims.

BRIEF DESCRIPTION OF THE DRAWINGS

Exemplary embodiments of the present invention will now be described, with reference to the accompanying drawings, in which.

DESCRIPTION OF PREFERRED EMBODIMENTS

The aforementioned problems are generally solved by adopting a low-latency, high-gain analog loop coupled with a log-detector. The log-detector simplifies the activity detection process, as detection can be performed at a much lower transmit power, for example at −10 dBm for, which allows greater latitude in the activity detection process. The low-latency, high-gain approach offers improved robustness against all possible temperature and power supply variations.

Notwithstanding the above, the inventive concept of the preferred embodiment of the present invention is preferably complemented with a ramp generation and saturation detection plus correction system. As these systems are naturally digital, this enhanced embodiment marries the existing digital system with the analog inner loop of a classical minor loop control architecture.

Furthermore, the robustness of the system is significantly enhanced by adopting a simplified and modified version of the Smith predictor. The simplification of the predictor is facilitated by the use of a multiloop control strategy where a high gain, low latency inner analog loop is placed immediately around the PA and detector. This allows the predictor to be simplified to just a pure gain and pure delay; modelling, respectively, the gain and delay through the inner analog loop.

Figure 1:
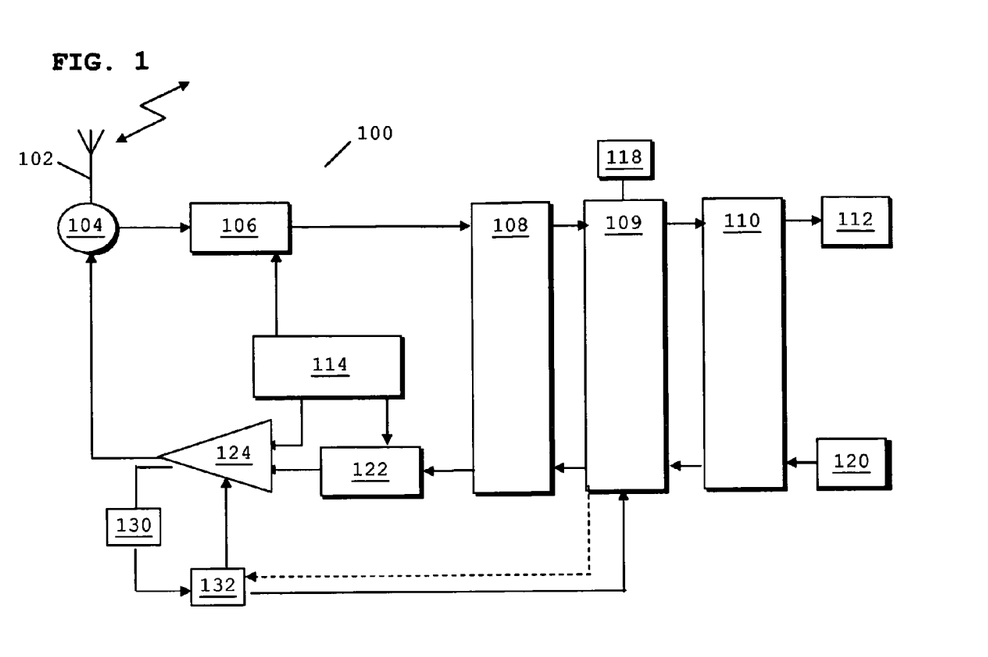
FIG. 1 illustrates a functional block diagram of a subscriber unit, adapted in accordance with various inventive concepts of a preferred embodiment of the present invention.

Referring now to FIG. 1, a block diagram of a subscriber unit, sometimes referred to as user equipment (UE) 100; adapted to support the inventive concepts of the preferred embodiments of the present invention, is illustrated. The subscriber unit 100 contains an antenna 102 preferably coupled to a duplex filter or antenna switch 104 that provides isolation between receive and transmit chains within subscriber unit 100.

The receiver chain includes receiver front-end circuit 106 (effectively providing reception, filtering and intermediate or base-band frequency conversion). The receiver front-end circuit 106 receives signal transmissions from another wireless communication unit, for example its associated Base station, associated BTS or direct from another subscriber unit. The receiver front-end circuit 106 is serially coupled to a signal processing function (generally realised by a digital signal processor (DSP)) 108. The processing function 108 performs de-interleaving, signal demodulation, error correction, data formatting, etc. of the received signal. Recovered information from the signal processing function 108 is serially coupled to a power control processing function 109, which extracts pertinent power control information from the received and decoded beacon signal and interprets the information to determine an appropriate transmit output level for the subscriber unit's transmissions.

In different embodiments of the invention, the signal processing function 108, power control processing function 109 and baseband processing function 112 may be provided within the same physical signal-processing device.

As known in the art, received signals that have been processed by the power control processing function 109 are typically input to a baseband-processing function 110. The baseband processing device 110 takes the received information formatted in a suitable manner and sends it to an output device 112, such as an audio speaker or liquid crystal display or visual display unit (VDU). A controller 114 controls the information flow and operational state of each circuit/element/function.

A timer 118 is preferably operably coupled to the entire signal processing functions to provide synchronisation in both the signal recovery and signal generation processes.

As regards the transmit chain, this essentially includes an input device 120, such as a microphone or keypad, coupled in series through baseband processor 110, a power control processing function 109, signal processing function 108, transmitter/modulation circuitry 122 and a power amplifier 124. The processor 108, transmitter/modulation circuitry 122 and the power amplifier 124 are operationally responsive to the controller 114, with an output from the power amplifier coupled to the duplex filter or antenna switch 104, as known in the art.

The transmit chain in subscriber unit 100 takes the baseband signal from input device 120 and converts this into a signal whose level can be baseband adjusted by the power control processor 109. The power control processor forwards the amplitude-adjusted signal to the signal processor 108, where it is encoded for transmission by transmit/modulation circuitry 122, thereafter amplified by power amplifier 124, and radiated from antenna 102. Clearly, the adjustment of the transmit output power can be effected by any amplitude or attenuation means in the transmit chain, and the above baseband adjustment is described as one example only.

Notably, in accordance with the preferred embodiment of the present invention, the transmitter employs a power control feature, whereby a sample of the transmitted signal is fed back to a power control function 132 via a coupler and a log detector 130. The power control function 132 is also responsive to the power control processor function 109.

The signal processor function 108 in the transmit chain may be implemented as distinct from the processor in the receive chain. Alternatively, a single processor 108 may be used to implement processing of both transmit and receive signals, as shown in FIG. 1. Furthermore, the various components within the subscriber unit 100 can be realised in discrete or integrated component form.

Furthermore, in the preferred embodiment, the majority of the power control functions are preferably implemented in a digital signal processor (DSP). However, it is within the contemplation of the invention that the power control processor circuitry described in the above embodiments can be embodied in any suitable form of software, firmware and/or hardware.

The various components within the subscriber unit 100 are realised in this embodiment in integrated component form. Of course, in other embodiments, they may be realized in discrete form, or a mixture of integrated components and discrete components, or indeed any other suitable form.

The preferred embodiment of this invention has two principle power control modes of operation, depending upon the modulation scheme: a Gaussian minimum shift keyed (GMSK) modulation and an 8-level phase shift keyed (8-PSK) modulation. For GMSK the power control is realised by adjusting the bias of the PA via a closed loop. Furthermore, in GMSK mode, the PA is activated or turned on by energising an inner analog loop immediately around the bias and detection points. In 8-PSK, power control is affected by manipulating the input power of the PA, as distinct from the bias, which is held constant. In addition, activation is accomplished by means of a digitally controlled attenuator in an open loop fashion.

Figure 2:
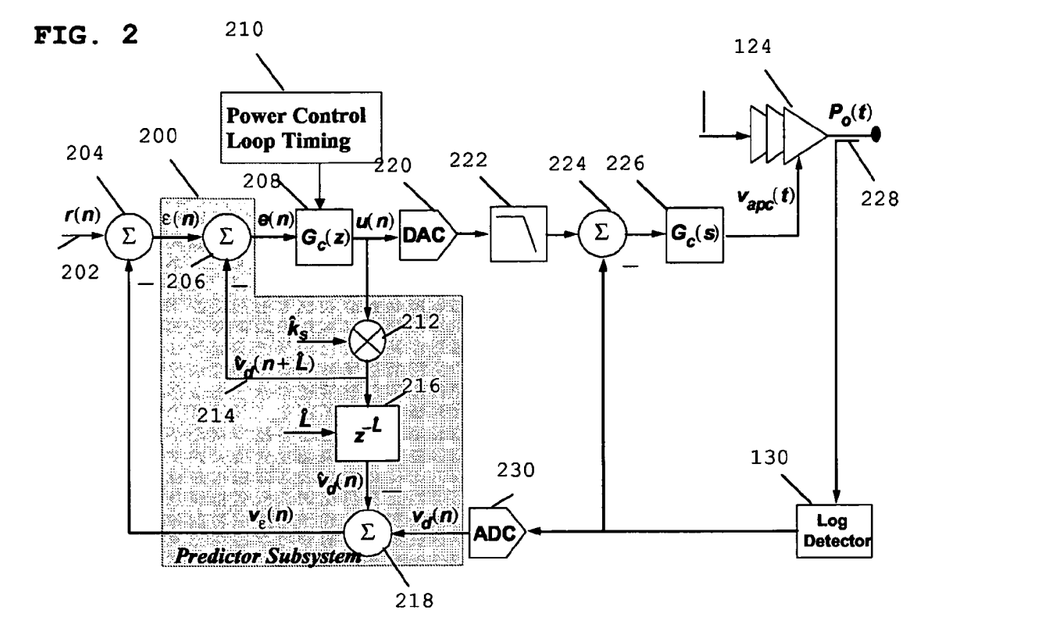
FIG. 2 illustrates a functional block diagram of a subscriber unit transmitter having a power control function and a predictor sub-system adapted to operate in GMSK mode incorporating the preferred embodiment of the present invention.

Referring now to FIG. 2, a functional block diagram of a predictor sub-system 200 of the power control function 132 of a subscriber unit, as applied to the GMSK mode and adapted to incorporate the present invention, is shown in more detail. Notably, the predictor sub-system 200 has been incorporated to mitigate against loop latency limitations.

The power control function 132 comprises an analog inner (or minor) feedback loop, which can be used, for example, for power amplifier control when the subscriber unit is operating in a Gaussian Minimum Shift Keyed (GMSK) mode.

The feedback loop preferably comprises a log-detector function 130 that allows the feedback loop to be closed at low (<−5 dBm) power levels. In this scenario, the inner analog loop has been incorporated to desensitize the system from 'large' variations in the control-slope of the power control signal.

In particular, the power control function (i.e. power control function 132 of FIG. 1) comprises a predictor sub-system 200 and preferably a simplified and modified Smith predictor sub-system. A well known arrangement for a Smith predictor is one that includes a delay line as well as the rest of the feedback system. Notably, the modified Smith predictor of the present invention only utilises a delay line and a gain block to replicate the system elements. The predictor system can be classified as follows:
where:
the output power is given by:

$P_o$ the bias voltage is given by:

$v_{apc}$ the controller outpout is given by:

$u(n)$ digital controller transfer function is given by:

$G_c(z)$ the controller error is given by:

$e(n)$ the ramp and predictor error is given by:

$\epsilon(n)$ the ramp reference is given by:

$r(n)$ the predictor modelling error is given by:

$v_\epsilon(n)$ the digitsed detector voltage is given by:

$v_d(n)$ the predicted detector voltage:

$\hat{v}_d(n)$ the estimated loop latency through the system (from digital-to-analog convertor (DAC) to analog-to-digital convertor (ADC))

$\hat{L}$ the loop latency free prediction of the detector voltage is given by:

$\hat{v}_d(n+\hat{L})$ and an estimate of the control slope from DAC to ADC is given by:

$\hat{k}_s$

The essential component of the system is the predictor sub-system 200, which is comprised of a gain stage 212 and a digital delay line 216. An estimate of the control slope is multiplied by the controller output. This forms the loop latency free prediction:

$\hat{v}_d(n+\hat{L})$

This loop latency free prediction is then delayed using a digital delay line block 216, where:

$\hat{L}$ is a static value. It is noteworthy that, by virtue of the inner analog loop, the gain may simplify to unity, thereby allowing the multiplier to be removed i.e.

$\hat{k}_s=1$

Notably, the digital control system incorporates two feedback loops: an inner loop (comprising summing junction 206, controller 208 and gain stage 212) that is closed using the estimated or predicted version:

$\hat{v}_d(n+\hat{L})$ of the latency free detector voltage, and an outer loop (comprising summing junction 204, summing junction 218, delay 216 and summing junction 202) that is closed using a modelling or predictor error, $v_\epsilon(n)$ The inner digital loop can be understood in terms of ensuring satisfactory ramping behaviour. Intuitively, as this inner loop is latency free, the loop gain and bandwidth can be increased to improve system robustness. The outer digital loop can be understood in terms of rejecting disturbances and predictor/modelling errors.

A skilled artisan will appreciate that the above circuit configuration is a preferred example of a circuit that can employ the inventive concepts described herein, and that may other circuit configurations can also benefit therefrom.

Notably, these digital loops are distinct from the analog minor loop, which is described in greater detail below.

Figure 3:
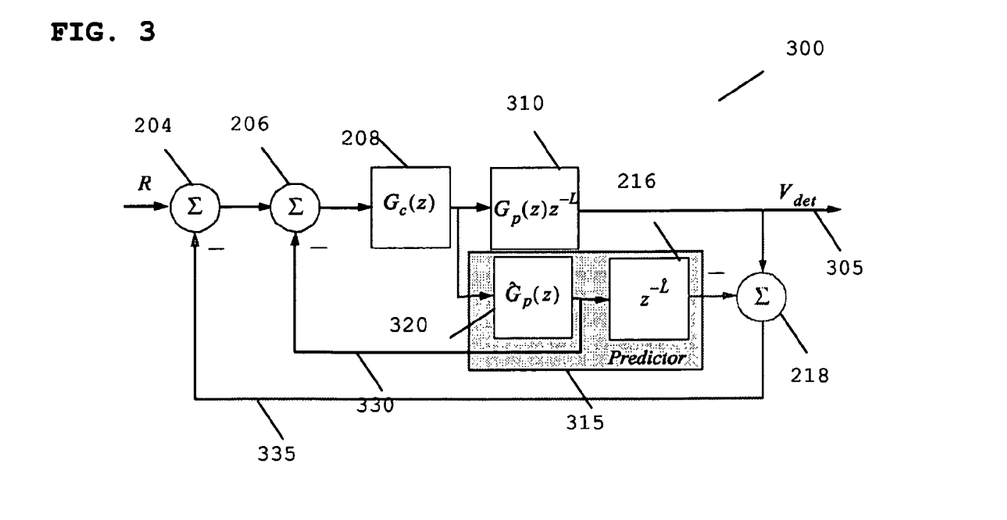
FIG. 3 illustrates a functional block diagram of a generic Smith predictor sub-system capable of being used in the embodiments of the present invention.
Figure 4:
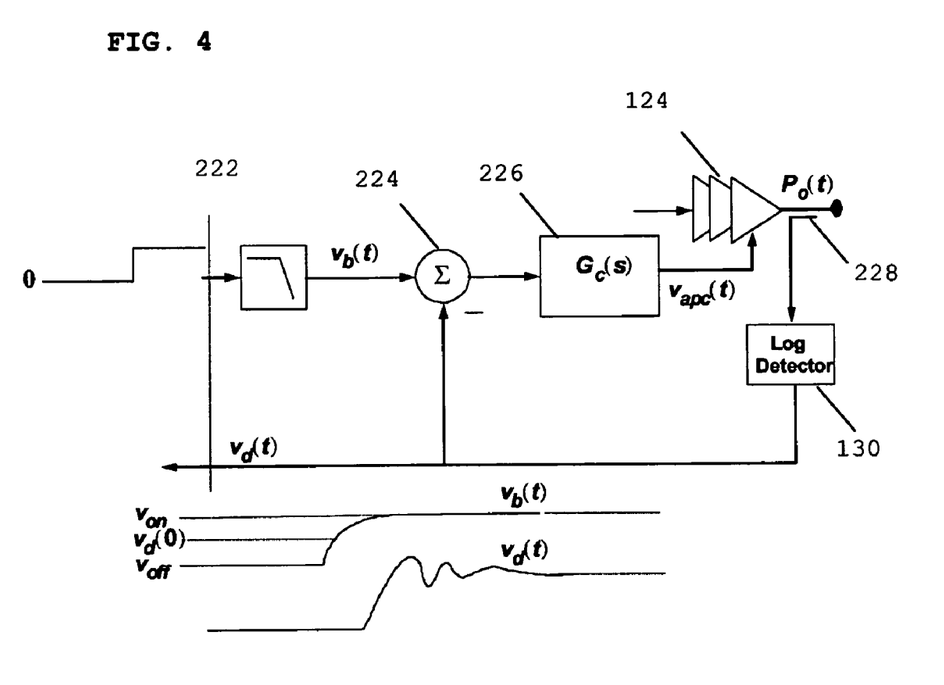
FIG. 4 shows a block schematic diagram and associated signal characteristics of the inner analog loop in the preferred embodiment of the invention.

Referring now to FIG. 3, a generic block diagram of a predictor based wireless rf PA control system 300 is illustrated, highlighting a preferred manner in which the the predictor subsystem is able to be integrated substantially seamlessly into an existing power amplifier control (PAC) system, for example in a 3GPP communication unit capable of operating in GMSK Mode. Notably, all existing functionality remains unchanged. In addition, FIG. 4 shows a block schematic diagram and associated signal characteristics of the open-loop power control scheme on which the arrangement of FIG. 3 is based.

The generic predictor 300 comprises a controller 208:

$G_c$

With the loop dynamics of latency block 310 shown as:

$$G_p(z)z^{-L}$$

A critical component is a predictor (or model) 320 of the loop:

$$\hat{G}_p(z)z^{-\hat{L}}$$

Where a model 320 of the latency free part of the loop is given by:

$$\hat{G}_p(z)$$

and a delay 216 equivalent to the loop latency is given by:

$$z^{-\hat{L}}$$

In addition, there are two negative feedback loops. A first inner loop 330 is latency free, which can therefore be arranged to have a relatively large loop gain and encompasses, $$\hat{G}_p(z)$$

An outer loop 335 is designed to reject mis-modelling and disturbances. The closed loop transfer function is given by:

$$\frac{V_{det}}{R} = \frac{G_c G_p z^{-L}}{1 + G_c \hat{G}_p + G_c(G_p z^{-L} - \hat{G}_p z^{-\hat{L}})}$$

If the predictor is accurate such that:

$$G_p z^{-L} - \hat{G}_p z^{-\hat{L}} \to 0$$

then the closed loop reduces to:

$$\frac{V_{det}}{R} = \frac{G_c G_p z^{-L}}{1 + G_c \hat{G}_p}$$

The fundamental feature of the predictor circuit 300 is that the loop latency no longer affects the closed loop poles, and hence loop stability. This is evident in the fact that no latency term is contained in the characteristic equation, $$1 + G_c \hat{G}_p = 0$$

Accordingly, the loop gain may be increased to widen the bandwidth, and hence facilitate greater robustness. Conversely, if the predictor is inaccurate, the mismodelling term:

$$(G_p z^{-L} - \hat{G}_p z^{-\hat{L}})$$

will feature, thereby allowing the latency to influence closed loop pole positions and hence loop stability.

Thus, the success of the predictor ultimately depends on the accuracy of the predictor.

The predictor is preferably clocked at the same rate as the controller. Additional transmitter sub systems, such as one designed to detect and correct for PA saturation, can advantageously remain unchanged, with the controller error:

$$e(n)$$

being used for, for example, for hard saturation detection and the controller output:

$$u(n)$$

used for soft saturation detection.

Advantageously, existing threshold mechanism/values for saturation detection can be used, with the controller and integrator being frozen once saturation has been detected.

The predictor is preferably configured with 2 constants, an unsigned control-slope gain estimate:

$$\hat{k}_s$$

and an unsigned latency estimate:

$$\hat{L}$$

Both values are static and will not change from burst to burst.

In an enhanced embodiment of the present invention, the predictor subsystem comprises a bypass mode, where the output of the gain multiplier is set to zero.

$$\hat{v}_d(n+\hat{L}) = 0$$

In this mode, the predictor error becomes the actual detector voltage: and the control error may be simplified to:

$$e(n) = r(n) - v_d(n)$$

The primary requirement in implanting the predictor block 315 is to arrive at an economical model that is still accurate enough to allow the loop bandwidth to be extended far enough to offer sufficient robustness to the control-slope variation.

Thus, the inventors of the present invention propose to combine:

(i) The linear phase or constant group delay of:

$$G_p(z)$$

with (ii) The pure latency of the loop, and include it in the delay of the predictor.

If we assume that the non-constant group delay is negligible, then the magnitude response of:

$$\hat{G}_p(z)$$

may be modelled as a scalar gain. In particular it can be modelled as the d.c gain of:

$$G_p(z)$$

A skilled artisan will appreciate that these assumptions are only valid over a restricted lower portion of the frequency response. Ultimately, due to the roll-off of the filters and inner analogue loop, the linear phase and constant gain assumption break down. In practice, though, the above assumptions allow the Power Amplifier Control (PAC) model to be easily created and implemented in software within the subscriber unit 100.

The d.c. gain of the inner analogue loop will be unity (assuming the inner analog loop incorporates integral action) so that the predictor gain will be determined primarily by the gain of the converters. If these are designed to be the same, then the gain will be unity allowing simplification in the gain block.

Defining:

$$\Phi(\Omega)$$

as the phase response of $$G_p(z)$$

where $$\Omega = e^{j\omega T_s}$$

and the sampling period is:

$$T_s$$

and then the delay estimate $$\tau_g(\Omega) = -\frac{d\Phi}{d\Omega}$$

is taken as the mean value of $$\tau_g(\Omega)$$

over a specified frequency span, $$\bar{\tau}_g$$

As the delay is preferably implemented in integer clocks units the latency estimate becomes:

$$\hat{L} = \left\lceil \frac{\bar{\tau}_g}{T_s} \right\rceil$$

As mentioned, the performance of the loop depends primarily on the accuracy of the predictor. The better the accuracy of the predictor, the more the loop bandwidth can be extended, whilst maintaining adequate stability margins. Consequently, the system robustness is improved.

Referring back to FIG. 2, an enhanced embodiment of the present invention comprises a novel use of a power activity detection mechanism with a self-activating inner and outer loop in a power amplifier that uses a log detector 130. Thus, an analogue inner loop comprises a low-pass (input ramp) filter 222 receiving an analogue output from the digital-to-analogue convertor (DAC) 220. The filter outputs the transmit signal to a summing junction 224.

Notably, referring to FIG. 4, the offset of the DAC 220:

$$v_{off}$$

is designed to be lower than the offset-voltage of the log detector 130, i.e. when the (worst case) minimum power is applied to the detector, the resultant detector o/p voltage, $$v_d(0)$$

must be greater than the offset of the PAC DAC 220.

This creates a negative error within the inner analog loop and holds the integrator in its reset or zero state. When an associated timer expires, the controller's accumulator and DAC register are then loaded with a value resulting in the analogue voltage being applied to the $$v_{on}$$

inner analog loop reference. The value is preferably selected such that the analogue voltage:

$$v_{on}$$

is greater than (the maximum)

$$v_d(0)$$

This condition triggers or activates the inner analog loop such that:

$$v_d \rightarrow v_{on}$$

with $$v_{apc}$$

and $$P_o$$

increasing from the off condition towards a nominal value of, say, −20 dBm. At the end of the burst, the integrator is reset and the analogue controller output set to zero and held there until the next burst.

Typically, the nonlinear, log nature of the log detector 130 requires a 'pre-distortion' log function, in the reference ramp generation circuit in order to avoid switching transient problems at high power. The detected voltage will then track the log of the reference while the output power will actually track the antilog or linear profile of the reference, and thus follow the true profile of the reference ramp (such as ½-raised cosine reference for example).

In a GMSK mode of operation, this pre-disortion function of the reference is not essential as the inner analog loop tends to linearise the effect of the log detector. However, for the 8-PSK mode, where the inner analog loop is not engaged, the distortion effect of the log detector has to be counteracted.

Figure 5:
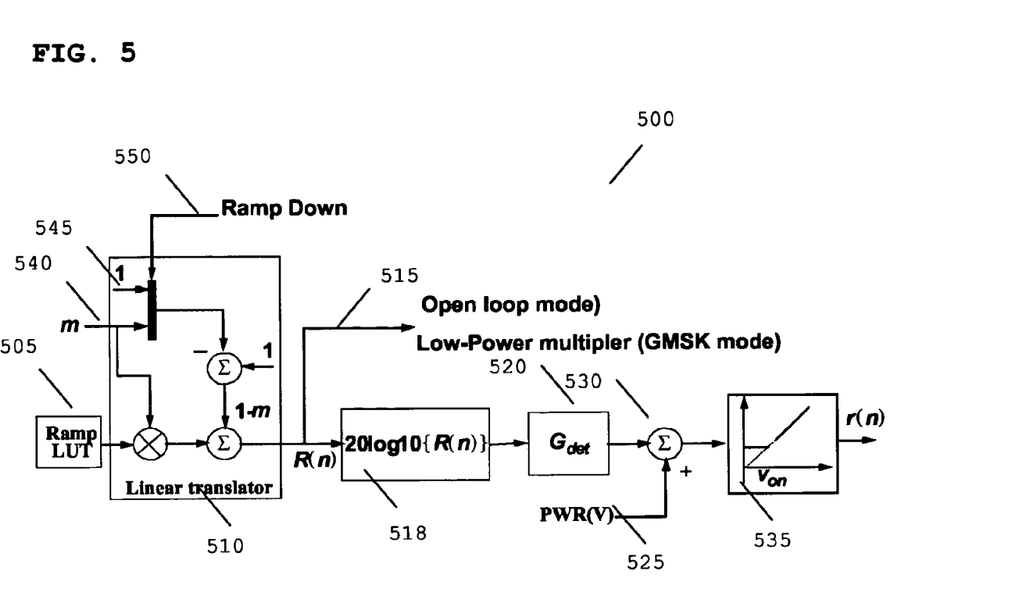
FIG. 5 shows an auto-scaled ramp-generator operation of the power control processing function of the preferred embodiment of the present invention.

In accordance with a yet further enhanced embodiment of the present invention, an approach is presented here that includes a log pre-distortion function 515 and an auto-scaling function 510 of the reference, as illustrated in FIG. 5. Referring now to FIG. 5, the auto-scaled ramp generator function 500 of the yet further enhanced embodiment of the present invention comprises a ramp generator 505 generating a normalised ramp look-up table (LUT) (based on a ½ & ¼ wave raised cosine) signal. The reference ramp generator contains ¼ and ½ wave raised cosine profiles that are designed to ensure satisfactory PvT and switching transients where the spectral content of these ramps have minimum high frequency content. The normalised ramp signal is input to a programmable linear translator (autoscaling) function 510.

Thus, in operation, the normalised ramp LUT is translated linearly to extend over a programmable range depending on the variable, 'm' 540, where 'm' is simply the slope of the linearly translator 510.

The constant offset '1-m' is calculated by subtracting the slope value from unity. In GMSK mode, after the initial delay timer has expired, or when ramping down in low power mode or when the ramp down delay timer has expired when ramping down in 8-PSK mode, the slope 550 is switched to unity and the offset becomes '0'.

The preferred embodiment of the present invention provides an advantageous and novel low power mode. The preferred low power mode of operation includes turning off the feedback path (i.e. disabling the ADC 230, DAC 220, filters 222, digital functions, etc. as well as the controller to save power when targeting a low power amplifier output power. Notably, this is the same operation as in the 8-PSK mode, where the feedback and controller are turned off once the desired target power is achieved. In this mode, the PA output power is still accurately attained but the transmitter is arranged to achieve this optimal output RF power with a minimum of power consumed by the control cct. This advantageous feature can be achieved safely when targeting low PA output power values as the need for closed loop regulation is not as critical as when targeting high PA output power values.

Thus, and notably, the output from the programmable linear translator (autoscaling) function 510 is then able to provide three distinct signals 515 that are dependent upon the mode of operation of the subscriber unit. A first output is applied to the logarithmic block 518. A second output is used in the low power GMSK mode and a third output is used in the 8-PSK mode.

The linearly translated reference ramp from the programmable linear translator (autoscaling) function 510 is then converted into a dB equivalent via the 20 log 10 (predistortion dB/V) function 518. In essence, the 20 log 10 function (predistortion dB/V) 518 pre-distorts the reference to compensate for the log nonlinearity of the log detector. This feature is crucial for the 8-PSK mode to provide sufficient switching transient margin. The 20 log 10 pre-disortion function 518 is not necessarily the optimal pre-distortion function for GMSK.

The output from the 20 log 10 pre-disortion function 518 is then scaled by:

$$G_{det}$$

in this example gain function 520, which corresponds to the gain from the power amplifier output to the ADC. This relative value is then converted into an absolute value by adding the factory phased power (PWR) value 525, in adder function 530.

When targeting low-powers it is possible that the initial sampled detector voltage may exceed the initial value of the ramp. This would result in a negative error and the loop attempting to drive the power below its current setting.

For example, say after the activation of the inner analog loop, the output power is at −15 dBm. Then, for a final target power of <10 dBm when the outer loop is engaged with 25 dB autoscaling, the initial response will be to drive the power below −15 dBm.
where $$v_{on}$$

is the sampled detector voltage prior to the outer digital loop closing.

In both GMSK or 8-PSK mode this detector voltage is sampled prior to the commencement of the closed loop ramp-up phase. This limiting feature should be applied only during the ramp up sequence and disabled during the ramp-down sequence to allow the PA to ramp-down to its 'off' condition.

The inclusion of a log-detector coupled to the power amplifier results in up to 60 dB variation in control-slope, between sub-threshold and maximum power settings. Even the allowable increase in the digital gain settings (due to the predictor) may provide insufficient robustness to this gain variation. To avoid having significant factory phasing in order to calibrate out this gain variation, a high-gain, low-latency loop is placed around the PA and log-detector. The analog inner loop makes the 'activity-detect' process more reliable and again requires less factory phasing to work.

Referring back to FIG. 2, and with reference to aforementioned analog minor loop of FIG. 2, an output from the log-detector 130 is compared with the output of the DAC bias reconstruction filter 222. The resultant error is then applied to the analog controller to produce the PA bias voltage:

$$v_{apc}(t)$$

The 'high' integral gain ensures the necessary robustness to the control-slope variation and, in particular, provides adequate bandwidth when the control-slope is at its minimum during ramp-down from the maximum power. In the preferred embodiment of the present invention, the proportional gain introduces a phase compensating, which is necessary to avoid ringing at sub-activity during the initial ramp-up when the control-slope is at its maximum.

The aforementioned description has been targetted towards a subscriber unit capable of operating in a GMSK mode of operation. However, a number of subscriber units, for example those capable of operating in accordance with the EDGE standard, are also able to use phase-shift keyed (8-PSK) signalling. 8-PSK has both phase (frequency) and amplitude modulation, in contrast to the GMSK signal that has phase (frequency) modulation with a constant amplitude. Therefore, two different systems have been developed for 8-PSK and GMSK.

Both the 8-PSK and GMSK systems must ramp-up and ramp-down their power in a controlled fashion to meet time mask and spectral requirements. The GMSK system controls the power amplifier (PA) output power by adjusting the PA bias; often termed the bias control mode. The 8-PSK system controls the PA output power by adjusting the power of the signal at the PA input. This is often referred to as the input power control mode. In input power control mode, the PA bias is set to a constant value based on desired output power and efficiency goals.

Figure 6:
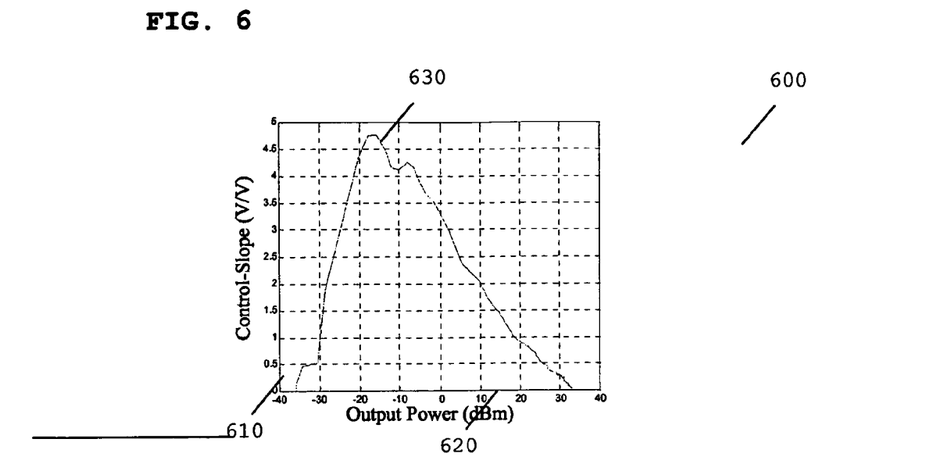
FIG. 6 illustrates a graph of control slope versus output power for a power amplifier combined with a log detector in the preferred embodiment of the present invention.

The accompanying plot in FIG. 6 shows a graph 600 of an example control-slope 610 versus output power (in dBm) 620 for a PA combined with a log detector. Closing the loop over the range of −10 dBm to 33 dBm can present a gain variation of around 60 dB. The predictor alone is unable to offer sufficient robustness to such a large variation in gain. A single gain setting of the digital controller would not be able to satisfy PvT requirements. For instance, at high power where the control-slope falls off, a 'high' controller gain setting is required to maintain the loop bandwidth and ensure satisfactory PvT during ramp-down. Conversely, at lower power, the controller gain has to be reduced. Otherwise, the 'high' control-slope 630 could cause ringing and again failure of the PvT.

To avoid such excessive factory phasing, a high-gain, low-latency analogue loop is placed around the PA, coupler and detector. Moreover, this loop will be closed permanently (whilst in GMSK mode), such that the activity detect is also performed in a closed loop fashion. Again, the motivation being a much more robust activity-detect behaviour.

The requirements for the analog controller can be stated as follows:
(i) It must provide a sufficiently high gain to maintain the bandwidth during ramp-down from high power settings, and
(ii) It must provide sufficient gain-phase margin that ramping-up is not problematic.

A classical two-term PI controller can adequately meet this requirement. This has the general form of:

$$G(z) = \frac{k_i}{s} + k_p = \frac{k_p(s + k_i/k_p)}{s}$$

The integral gain term is chosen primarily to ensure adequate loop gain for the ramp-down condition. The proportional gain term is then selected to introduce a zero at a specific location, so as to maintain the gain-phase margin.

Let us consider a simplified, small signal block diagram of the closed loop AOC system without the predictor. The controller, $$G_c(z)$$

uses integral action only. The small signal response of the inner analog loop, (including the PA, coupler, detector and controller) is modelled by:

$$G(s) = \frac{G_c(s)G_{rf}(s)k_s}{1 + G_c(s)G_{rf}(s)k_s}$$

where the analog controller is:

$$G_c(s)$$

and the small signal ac response of the PA is:

$$G_{rf}(s)$$

and the detector is:

$$V_{det}/V_{apc}$$

The small signal dc gain from the bias to the detector is modelled by the control-slope, $$k_s$$

The ADC is modelled as an ideal sampler.

A skilled artisan will appreciate that such configurations and values are only examples, and any number of other configurations and values may be used to benefit from the inventive concepts described herein.

Writing the open loop transfer as:

$$G_{ol}(z)=G_c(z)G_p(z)(1+\Delta)$$

where $G_p$ is the combined transfer function of the analog inner loop, converters and filters, and $1+\Delta$ represents the variation in inner analog loop due, primarily, to control-slope variation.

This allows the closed loop to be expressed as:

$$\frac{V_{det}}{R} = \frac{G_c(z)G_p(z)(1+\Delta)}{1+G_c(z)G_p(z)(1+\Delta)}$$

An underlying tenet of closed loop control can be employed to desensitise the system from slope variation by having:

$$|G_{OL}| \to \infty$$

However, this ideal is achievable only over a restricted bandwidth as loop stability must also be ensured. This restriction in bandwidth fundamentally limits the robustness of the loop in addition to disturbance rejection and reference tracking. Typically the loop must be designed such that:

$$|G_{OL}| \geq 1$$

For:

$$\arg\{G_{OL}\} \geq -145°$$

and:

$$|G_{OL}| < 1$$

for:

$$\arg\{G_{OL}\} < -145°$$

i.e. a 35-degree phase margin.

The source of this limitation can be traced back to the excessive loop latency within the system with the primary contributors being the ADC and DAC conversion times the reconstruction and anti-aliasing filter and the small signal ac phase response through the control path of the PA and detector. This latency results in the loop phase response decreasing from −90° (set by the integrator of the controller) towards −180° at a restrictively low BW, e.g. 100 kHz. Besides reducing the latency, an alternative control algorithm is required that will maintain the phase response above −180° for a much 'larger' bandwidth. A Smith predictor modified as hereinbefore described can be used one such preferred algorithm.

The inner analog loop on its own offers adequate robustness to the range of expected variations, as a low gain, single setting of the digital integrator would suffice. In fact, the analog loop alone, without any outer digital loop, would be sufficient. However, as the existing digital interface is needed for ramp generation and saturation detection plus correction, the existing digital controller augmented by the predictor is used to enhance the overall robustness of the system. The inner analog loop is not used for the 8-PSK mode of operation. The extra overhead arising from the introduction of a predictor is minimum as the same hardware is needed for the 8-PSK mode.

Figure 7:
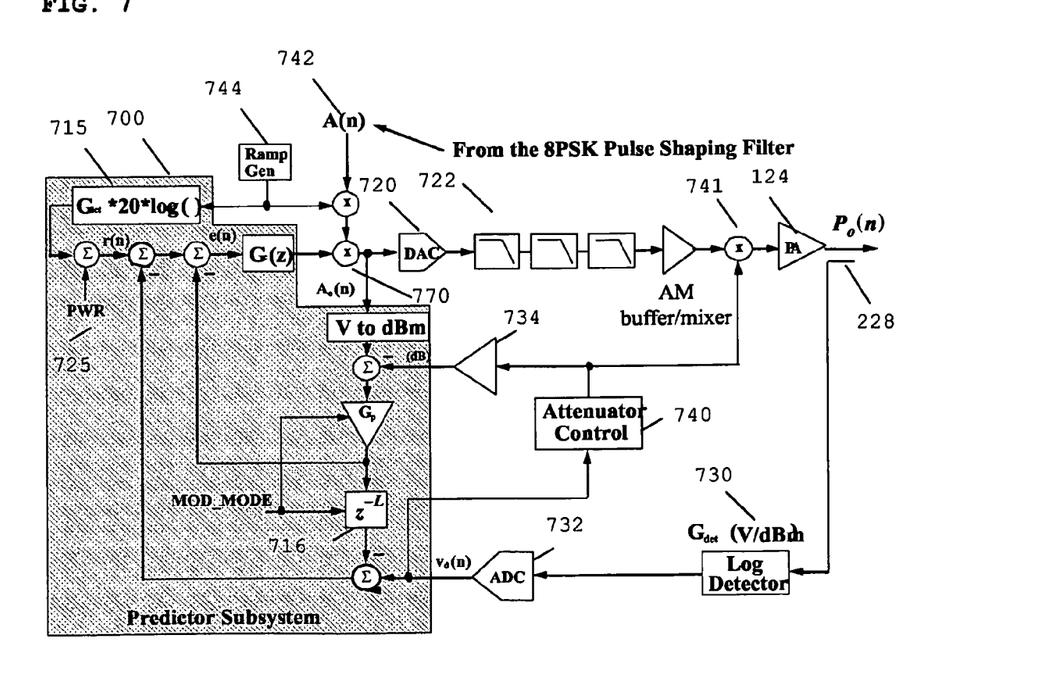
FIG. 7 illustrates a functional block diagram of a subscriber unit transmitter having a power control function and a predictor sub-system adapted to operate in an 8-PSK mode incorporating the preferred embodiment of the present invention.
Figure 8:
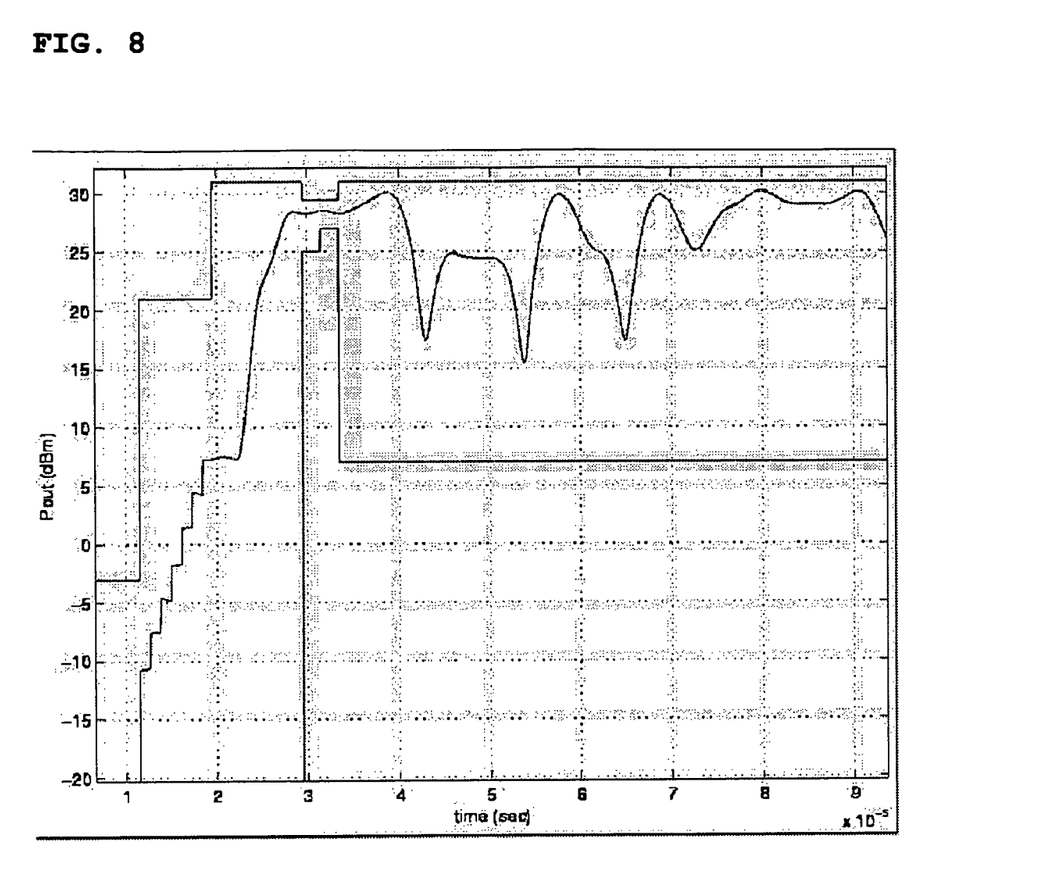
FIG. 8 illustrates an 8-PSK ramp-up diagram indicating an open loop/closed loop ramping operation in an enhanced embodiment of the present invention.

Referring now to FIG. 7, a functional block diagram of a predictor sub-system 700 of a subscriber unit 100, adapted to incorporate a further embodiment of the present invention, is shown in more detail. Again, a power control function comprises a mixed signal feedback loop, which can be used, for example, for power amplifier control when the subscriber unit is operating in an 8-phase shift keyed (8-PSK) mode.

The configuration in FIG. 7 is similar to that described in FIG. 2 for a GMSK mode, as a number of components are re-used in both modes. Hence, for those components whose operation is the same as that described in FIG. 2, no additional description will be provided herein. Again, the feedback loop preferably comprises a log-detector function 730 that allows the feedback loop to be closed at low (<−5 dBm) power levels. The power control function (i.e. power control function 132 of FIG. 1) comprises a digital predictor sub-system 700. It is noteworthy that the analogue inner loop is disabled in 8-PSK mode.

In an 8-PSK mode, a signal A(n) 742 is the amplitude portion of the 8-PSK modulated signal. Other signals are the same as described for the GMSK mode in FIG. 2. Thus, the difference in the predictor for transmitter operation in the 8-PSK mode are in its control input $A_o(n)$ and the estimates for the gain and delay. Preferably, the control input $A_o(n)$ 742 includes the effects of the amplitude data, as scaled by the ramp generator 740.

Contrary to the GMSK mode, the PA bias is not manipulated, i.e. it is actually held constant in 8-PSK mode. Instead the gain of the AM signal is manipulated to affect the desired output power.

The autoscaled, predistorted reference ramp waveform is used as a reference for the loop, while a normalised ramp is used to profile the AM input via DAC 720. In fact, during the ramp-up phase the amplitude modulated AM signal, A(n), 742 is held approximately constant.

The 8-PSK system performs ramp-up using an open-loop ramping phase followed by a closed loop ramping phase. A sample of the RF power from the PA 124 is taken by the directional coupler 228 and input to log detector 730. The analogue signal output from the log detector 730 is then input to the ADC 732 and the digital output attenuated and fed to an AM buffer stage 734 in the feedback loop of the outer digital loop. Open loop ramping operation is performed using a step attenuator control 740, which monitors the output of the ADC 732 and controls the step attenuator 760. The main purpose of the step attenuator control 740 is to provide extra dynamic range for the system so that the AM buffer only needs to be able to provide a ramping range of approx. 20 dB during the closed loop ramp-up phase. A default step attenuator value is set at maximum attenuation, and reduction of attenuation is done in, for example, 3 dB steps. Note that the step attenuator control 740 may also be used in GMSK mode, where it is programmed to its minimum attenuation setting to provide maximum power at the PA input. No ramping of the step attenuator is performed in GMSK mode.

An attenuator algorithm brings the output power from an 'off' state to approximately 20 dB below the final target power. This is achieved in an open loop mode with the digitally, predictor-based controller turned 'off'. When the attenuator terminates and approximately 10 uS before the $1^{st}$ valid data symbol is transmitted, the digital predictor loop is closed and the power is ramped up to the desired target power.

The basic sequence of events for the step attenuator control 740 in 8-PSK mode is as follows. First, the step attenuator 740 is programmed to an initial value and a control sequence commences, say approx. 18 usec, prior to the first data bit being transmit. A specified delay, say of about 21 clock cycles, is expected before a change in step attenuation is seen at the detected signal at the output of the ADC 732.

If the detected signal is greater than the desired detected power for the beginning of the closed loop ramp-up, then the step attenuation value is then held for the duration of the transmit burst. Otherwise, the step attenuation is reduced by 3 dB and the specified delay is then re-enacted. Once the step attenuation control is complete, a closed loop ramp-up process using the AM buffer 734 commences.

A major function of the 8-PSK PAC system design is the performing of the closed loop ramp-up. The output power at the beginning of this stage is typically set to be 20 dB below the final output power. This closed loop ramp range is programmable and of the order of 20 dB. The final output power can be determined from the setting for PWR. Notably, the 8-PSK system for closed loop ramp-up utilises an integrator controller with the Predictor 700. The output of the integrator is used to adjust the gain of the amplitude path.

In an 8-PSK operational mode input power control is performed along the AM path, to effect power regulation. This is in contrast to the GMSK mode that uses bias control.

During the active part of the burst, the GMSK system remains in a closed-loop operation to keep the PA running at maximum efficiency. Since 8-PSK data has amplitude modulation, the 8-PSK system runs open-loop and does not attempt to track PA variations over a timeslot. The controller output is held constant. The 8-PSK amplitude signal is scaled by this constant control output, applied to the AM DAC 720 and suitably filtered via filters 722.

At the end of a burst, the GMSK system remains in a closed-loop mode and ramps down the power by reducing the PA bias. However, the 8-PSK system remains open loop and the ramp generator ramps down the amplitude signal to zero by using the normalized reference ramp output to scale the AM signal via 720. This will then bring the AM path down in a raised cosine manner. Last, the step attenuator control 740 is programmed back to maximum attenuation, to prepare for the next burst.

As previously mentioned, it is within the contemplation of the invention that many circuit configurations can be implemented that could benefit from the inventive concepts herein described. For example, there is no need for an inner analogue loop as exemplified by the 8-PSK embodiment. Furthermore, the predictor gain need not necessarily be a constant as the gain could be changed, for example, depending on the target power. Similarly, the predictor latency need not necessarily be a constant and can be arranged, for example, to be dependent upon target power, frequency setting, etc.

It will also be appreciated by a skilled artisan that the inventive concepts are not limited to a 3G or 2.× G wireless communication device, but are applicable to any wireless communication device that utilizes power control.

It is envisaged that the aforementioned inventive concepts may also be applied to a large number transceiver architectures and platform solutions, for example a semiconductor manufacturer may employ the inventive concepts in a design of a stand-alone RFIC and/or application specific integrated circuit (ASIC) and/or any other sub-system element.

It will be understood that the method and arrangement for closed-loop power control described above provides at least one or more of the following advantages:
 (i) Enhanced robustness to process, temperature, frequency and ageing variations;
 (ii) Reduced sensitivity to loop latency/lag;
 (iii) Simplified and more robust activation;
 (iv) Log predistortion and autoscaling of reference improves switching transients;
 (v) Multimode operation (i.e. GMSK and 8-PSK modes); and
 (vi) Overall, simplified, less factory phasing/calibration required.

Hence, the aforementioned method and arrangement for providing power control substantially negates at least the problems associated with the loop latency and extensive factory fine-tuning/phase control of the loop.

Whilst specific, and preferred, implementations of the present invention are described above, it is clear that one skilled in the art could readily apply variations and modifications of such inventive concepts.

Thus, a wireless communication having a power control system has been described wherein the aforementioned disadvantages associated with prior art arrangements have been substantially alleviated.

The invention claimed is:

1. A wireless communication unit comprises:
 a transmitter comprising an analogue feedback power control loop having a power control function arranged to set an output power level of the transmitter, the power control function comprising a predictor sub-system arranged to reduce sensitivity to loop latency of the analogue feedback power control loop, the predictor sub-system comprising a digital control system having a digital inner feedback loop that is to be closed based upon a predicted power control level, the digital inner feedback loop comprising:
 a first summing junction;
 a predictor; and
 a gain stage.

2. A wireless communication unit according to claim 1 wherein the predictor sub-system is arranged to support transmission in an 8-PSK mode and a GMSK mode of operation.

3. A wireless communication unit according to claim 1 wherein the digital control system further comprises a digital outer feedback loop that is to be closed based upon a modeling or predictor error in GMSK mode.

4. A wireless communication unit according to claim 3 wherein the digital outer feedback loop comprises:
 a second summing junction;
 the first digital inner feedback loop;
 a digital delay; and
 a third summing junction that is to be closed based upon a modeling or predictor error.

5. A wireless communication unit according to claim 1 wherein the analogue feedback power control loop comprises a coupler and a log-detector providing a wide power control range.

6. A wireless communication unit according to claim 5 wherein the analogue feedback power control loop comprises a digital-to-analogue converter (DAC) wherein an offset voltage associated with the DAC, is arranged to be lower than an offset-voltage of the log detector.

7. A wireless communication unit according to claim 1 wherein the analogue feedback power control loop is arranged to be a low-latency, high-gain analogue loop.

8. A wireless communication unit according to claim 1 wherein the digital control system comprises a ramp generation circuit having a linear translator arranged to autoscale a ramp reference.

9. A wireless communication unit according to claim 8 wherein the linear translator is operably coupled to a log predistortion arranged to counteract an effect of the log detector.

10. A wireless communication unit according to claim 9 wherein the linear translator outputs a low-power multiplier signal to autoscale a reference in GMSK mode.

11. A wireless communication unit according to claim 8 wherein the linear translator outputs an amplitude modulated signal to autoscale a reference in 8-PSK mode.

12. A wireless communication unit according to claim 11 wherein a control slope of a ramp-down signal of the transmitter is switched to unity when ramping down.

13. A wireless communication unit according to claim 1 wherein the gain stage is set to zero to support a bypass mode.

14. A wireless communication unit according to claim 1 wherein the digital control system predictor subsystem combines a linear phase or constant group delay of a system to be combined with pure latency or delay of a system.

15. A wireless communication unit according to claim 1 wherein the digital control system comprises a saturation detection plus correction system.

16. A wireless communication unit according to claim 1 wherein the digital control system comprises an activity detector in GMSK mode.

17. A wireless communication unit according to claim 16 wherein a digital controller of the digital control system sets a signal amplitude reference for the analogue feedback power control loop.

18. A wireless communication unit according to claim 1 wherein the digital control system comprises a step attenuator controller in 8-PSK mode.

19. A wireless communication unit according to claim 1 wherein the transmitter supports a low power mode, whereby components in the analogue feedback loop are disabled when targeting a low power amplifier output power.

20. An integrated circuit for use in a wireless communication device comprises:
  a transmitter;
  an analogue feedback power control loop having a power control function arranged to set an output power level of the transmitter; and
  wherein the power controller comprises a predictor sub-system arranged to reduce sensitivity to loop latency of the analogue feedback power control loop, the predictor sub-system comprising a digital control system comprising:
    a digital inner feedback loop that is to be closed based upon an estimated or predicted power control level; and
    a ramp generation circuit having a linear translator arranged to autoscale a ramp reference.

21. An integrated circuit according to claim 20 wherein the linear translator is operably coupled to a log predistortion arranged to counteract an effect of the log detector.

22. An integrated circuit according to claim 20 wherein the linear translator outputs an amplitude modulated signal to autoscale a reference in 8-PSK mode.

23. A wireless communication unit comprises:
  a transmitter;
  an analogue feedback power control loop having a power control function arranged to set an output power level of the transmitter; and
  wherein the power controller comprises a predictor sub-system arranged to reduce sensitivity to loop latency of the analogue feedback power control loop, the predictor sub-system comprising a digital control system comprising:
    a digital inner feedback loop that is to be closed based upon an estimated or predicted power control level; and
    a ramp generation circuit having a linear translator arranged to autoscale a ramp reference.

24. A wireless communication unit according to claim 23 wherein the predictor sub-system is arranged to support transmission in an 8-PSK mode and a GMSK mode of operation.

* * * * *